United States Patent [19]

Shindo et al.

[11] Patent Number: 5,198,987
[45] Date of Patent: Mar. 30, 1993

[54] WIRING-PATTERN-DETERMINATION SYSTEM

[75] Inventors: Tatsuya Shindo, Kawasaki; Kaoru Kawamura, Yokohama, both of Japan

[73] Assignee: Fujitsu Limited, Kawasaki, Japan

[21] Appl. No.: 602,863

[22] Filed: Oct. 24, 1990

[30] Foreign Application Priority Data

Oct. 24, 1989 [JP] Japan .................. 1-276379

[51] Int. Cl.$^5$ .................. G06F 15/60; G06F 15/16
[52] U.S. Cl. .................. 364/490; 364/489; 364/488; 395/800
[58] Field of Search .................. 364/488, 489, 490, 491; 395/800

[56] References Cited

U.S. PATENT DOCUMENTS

| | | | |
|---|---|---|---|
| 4,752,887 | 6/1988 | Kuwahara | 364/491 |
| 4,855,929 | 8/1989 | Nakajima | 364/490 |
| 5,032,991 | 7/1991 | Davidson et al. | 364/490 |

FOREIGN PATENT DOCUMENTS

0248513A3 12/1987 European Pat. Off. .

OTHER PUBLICATIONS

"A Parallel Processing Approach for Logic Module Placement" by K. Ueda et al., IEEE Trans. on Computer-Aided Design, vol. CAD-2, No. 1, Jan. 1983, pp. 39-47.

"A Placement Algorithm for Array Processors" by Chyan et al., IEEE 20th Design Automation Conf. 1983, pp. 182-188.

"Placement by Simulated Annealing on a Multiprocessor" by Kravitz et al., IEEE Trans. on Computer-Aided Design, vol. CAD-6, No. 4, Jul. 1987, pp. 534-549.

*A Preliminary Investigation into Parallel Routing on a Hypercube Computer*, O. A. Olukotun and T. N. Mudge, 24th ACM/IEEE Design Automation Conference Proceedings, 1987, pp. 814-820.

*A Parallel Adaptable Routing Algorithm and its Implementation on a Two-Dimensional Array Processor*, Takumi Watanabe et al., IEEE Transactions on Computer-Aided Design of Integrated Circuits and Systems CAD-6, No. 2, pp. 241-250 (Mar. 1987).

*Maze Routing On A Hypercube Multiprocessor Computer*, Youngju Won and Sartaj Sahni, IEEE International Conference on Parallel Processing Proceedings, 1987, pp. 630-637.

*Primary Examiner*—Vincent N. Trans
*Attorney, Agent, or Firm*—Staas & Halsey

[57] ABSTRACT

A wiring pattern determination system includes a label setting unit for setting labels from a starting point to an ending point by performing a labeling utilizing a maze running, and a reference point setting unit for setting a corner of a wiring pattern to be determined or the ending point as a reference point for a back trace of the maze running. The wiring-pattern-determination system has a corner judging unit for judging the next corner as the next reference point based on the label set at the reference point, a termination judging unit for judging the termination of the back trace when the starting point and the corner determined by the corner judging unit match and a reference point revising unit for instructing the reference point setting unit to set the next corner as a new reference point when the starting point and the corner determined by the corner judging unit mismatch. In the back trace, the wiring pattern is immediately and quickly determined between the corner and the next corner obtained by the corner judging unit.

16 Claims, 15 Drawing Sheets

| CONTENT OF GLOBAL MEMORY | | CONTENT OF PROCESSOR MEMORY | |
|---|---|---|---|
| ARROW DIRECTIONAL LABEL | 4 BIT | WIRING PROHIBITION FLAG | 1 BIT |
| COORDINATE X | 16 BIT | SOURCE FLAG | 1 BIT |
| COORDINATE Y | 16 BIT | TARGET FLAG | 1 BIT |
| | | ARROW DIRECTIONAL LABEL (NORTH) FLAG | 1 BIT |
| | | ARROW DIRECTIONAL LABEL (EAST) FLAG | 1 BIT |
| | | ARROW DIRECTIONAL LABEL (SOUTH) FLAG | 1 BIT |
| | | ARROW DIRECTIONAL LABEL (WEST) FLAG | 1 BIT |
| | | COORDINATE X | 16 BIT |
| | | COORDINATE Y | 16 BIT |
| | | BACK TRACE STARTING POINT FLAG | 1 BIT |
| | | BACK TRACE STARTING POINT CANDIDATE FLAG | 1 BIT |

Fig. 3B

|   | 1 | 2 | 3 | 4 | 5 | 6 | 7 | 8 | 9 | 10 | 11 | 12 | 13 |
|---|---|---|---|---|---|---|---|---|---|----|----|----|----|
| A | 9 | 8 | 7 | 8 | 9 |   | 11 | 12 | 13 | 14 | 15 | 16 | 17 |
| B | 8 | 7 | 6 | 7 | 8 | 9 | 10 | 11 | 12 | 13 | 14 | 15 | 16 |
| C | 7 | 6 | 5 | 6 | 7 | 8 | 9 | 10 | 11 | 12 | 13 | 14 | 15 |
| D | 6 | 5 | 4 | 5 | 6 |   | 10 | 11 | 12 | 13 | 14 | 15 | 16 |
| E | 5 | 4 | 3 | 4 | 5 |   | 11 | 12 | 13 | 14 | 15 | 16 | 17 |
| F | 4 | 3 | 2 | 3 | 4 |   |   |   |   |   |   | 17 | 18 |
| G | 3 | 2 | 1 | 2 | 3 |   | 23 | 22 | 21 | 20 | 19 | 18 | 19 |
| H | 2 | 1 | S | 1 | 2 |   | 24 | 23 | 22 | 21 | 20 | 19 | 20 |
| I | 3 | 2 | 1 | 2 | 3 |   | 25 | 24 | 23 | 22 | 21 | 20 | 21 |

Fig. 4B

WIRING-PATTERN-DETERMINATION SYSTEM

BACKGROUND OF THE INVENTION

1. Field of the Invention

This invention relates to a wiring-pattern-determination system for designing wiring patterns of a PC board or LSI chip based on maze running.

2. Background of the Related Art

For instance, the problem of large scale combination including LSI CAD such as of wiring processing requires very high speed processing. The method can be speeded up by high speed processing of a massively parallel computer containing numerous processors.

Maze running is an algorithm to find a path of two points in the shortest length, and is widely used for routing patterns of a PC board or LSI chip. In maze running, the plane in consideration comprises grid points which are wiring units. The source (originating point) and target (end point) are set on grid points in the first stage. Then a labeling and a back-trace are used to determine the wiring pattern (net). Here, the labeling assigns the label n+1 to a grid point neighboring the nth empty (without an interference) grid point from the source, e.g., assigning label 1 to an empty grid point neighboring the source and assigning label 2 to an empty grid point neighboring the grid point assigned to label 1, until there is no more neighboring grid point or the label has reached the target. A back-trace traces back each grid point assigned to a label starting from the target to the source so that the numbers of the labels assigned to each grid point are reduced by one.

Recently, as the PC board and LSI chip are increasing in density, the amount of data in consideration by maze running, i.e., the data scale handled, is increased. Then the speed up of a wiring processing is desired, and a specialized hardware and parallel processing has been tried.

For instance, a processor is assigned in one-to-one correspondence to each grid point and a communication port connects between neighboring processors. Each processor on a wavefront (the grid point with the same label) is parallel activated in labeling, and labels to the neighboring processors travel done in parallel. The processor on the wavefront processes in parallel to speed up the method.

However, it is a problem that the back-trace cannot be speeded up by the parallel processing easily.

In the back trace, a wiring path is determined by tracing back to the processor corresponding to the source via the label assigned in the labeling from the processor corresponding to the target. While only two processors communicate information of the path, all other processors are standing by at a particular point in time. Hence, a disadvantage of the parallelism exists in the processing not fully exploited as a whole.

SUMMARY OF THE INVENTION

An object of the invention is to provide a wiring-pattern-determination system for speeding up the back-trace of maze running.

A feature of the present invention resides in a wiring-pattern-determination system comprising a label setting means for setting labels from a beginning point to an ending point by performing a labeling utilizing a maze running a reference point setting means for setting a corner of a wiring pattern to be determined or for setting said ending point as a reference point for a back-trace of said maze running, a corner judging means for judging the next corner of the wiring pattern as the next reference point based on the label set at the previous reference point by said reference point setting means a termination judging means, for judging the termination of the back-trace when said beginning point and the corner determined by the corner judging means match and a reference point revising means for instructing said reference point setting means to set the next corner as a new reference point when said beginning point and the corner determined by said corner judging means mismatch.

BRIEF DESCRIPTION OF THE DRAWINGS

FIG. 3B is a table that shows the content of the processor memory and global memory of this embodiment, FIGS. 4A through 4D explain how the labeling of this embodiment progresses.

DESCRIPTION OF THE PREFERRED EMBODIMENT

Figure 1:
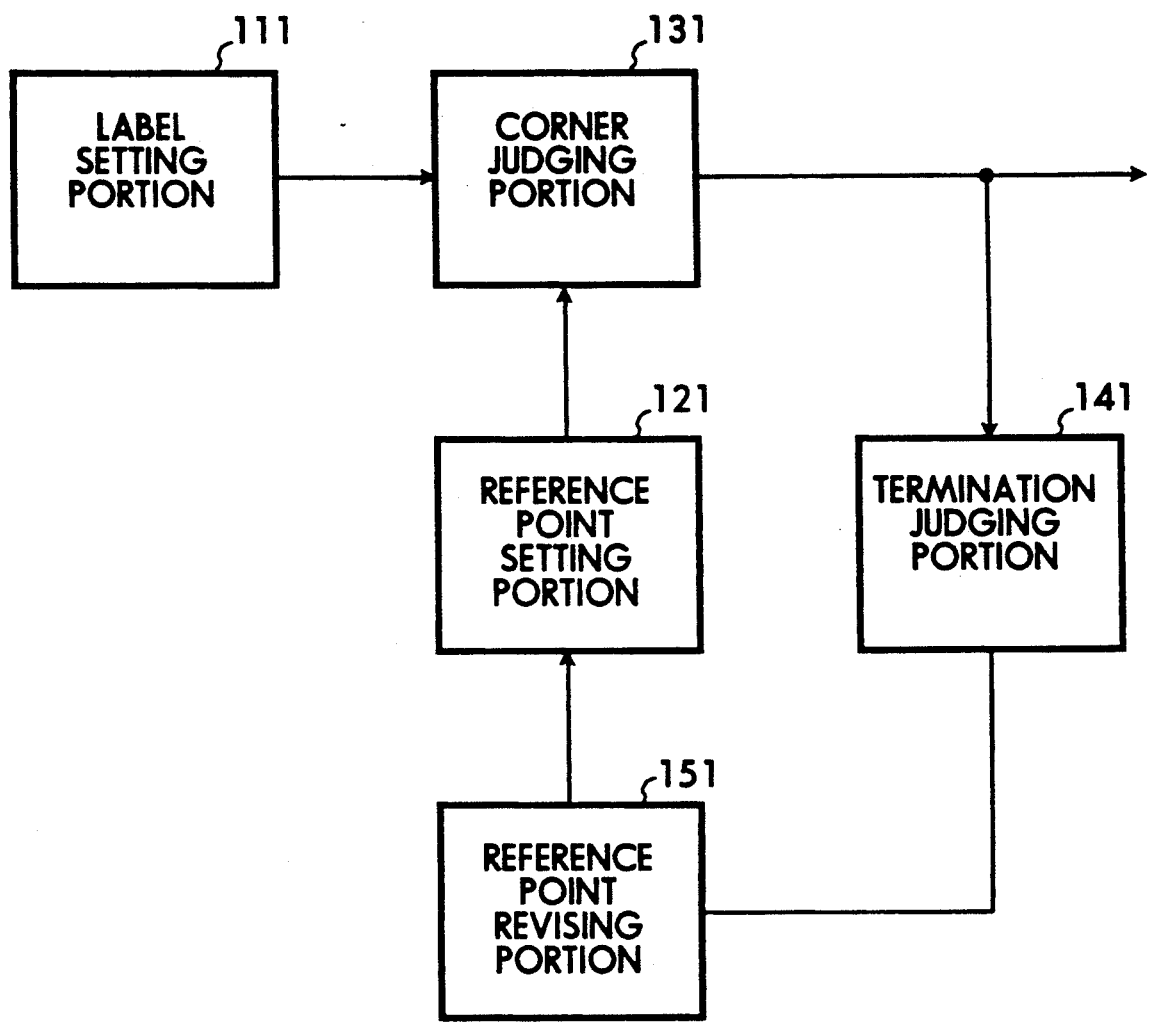
FIG. 1 is a principle block diagram of the wiring-pattern-determination system of this invention.

FIG. 1 is a principle block diagram of the wiring-pattern-determination system of this invention.

In FIG. 1, a label setting means or portion 111 assigns a label from the origin to the end point by performing a labeling according to the maze running.

A reference point setting means 121 sets a corner.. of the wiring pattern to be determined by setting the end point, as a reference point of the back-trace of the maze running.

A corner judging means 131 determines the next corner of this reference point, based on the label assigned to the reference point set by the reference point setting means 121.

A termination judging means 141 judges a termination of a back-trace when the origin and the corner determined by the corner judging means 131 match.

When the origin and the corner determined by the corner judging means 131 mismatch, a reference point revising means 151, instructs a setting of the corner as a new reference point using the reference point setting means 121.

Consequently, the determination of wiring pattern by the back-trace is configured to be made entirely in a unit of a corner.

The label setting means 111 assigns labels from the origin to the end point according to the maze running. Then, the following back-trace is made.

First, the reference point setting means 121 sets the end point as the reference point. Based on this label assigned to this reference point, the corner judging part 131 detects the corner or bending angle next to the reference point (the end point) on a wiring pattern. The termination judging means 141 judges or not the detected corner is an origin, i.e., whether the back whether trace is completed. If the detected corner is not an origin, the reference point revising means 151 sends an instruction to the reference point setting means 121 to revise the reference point. The reference point setting means 121 then resets the corner detected by the corner detecting means 131 as the new reference point.

Later, similar processings are performed by detecting the next corner for the new reference point, until the detected corner reaches the origin.

In this invention, since the detection of the next corner by setting the corner as the reference point determines the wiring pattern, the bee line path between corners is determined immediately.

Figure 2:
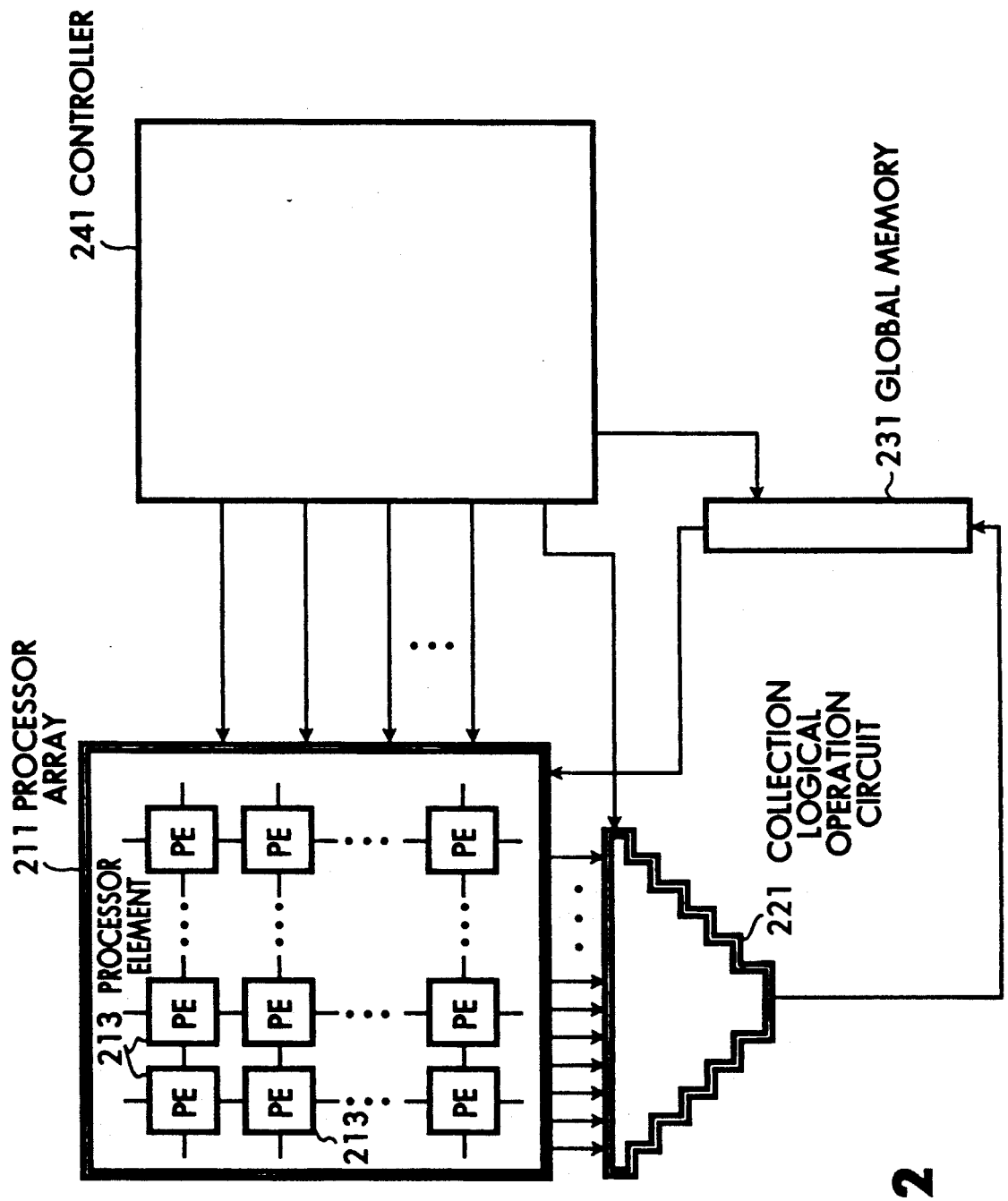
FIG. 2 is a configuration diagram of the preferred embodiment of this invention.

The following is a detailed description of an embodiment of this invention by referring to FIG. 2.

FIG. 2 shows a configuration of the embodiment applied to the wiring-pattern-determination system of this invention, and is for determining the wiring pattern of a PC board or an LSI chip by applying the maze running.

In FIG. 2, 211 is a processor array, 213 is a processor element (PE), 221 is a collection logical operation circuit; 231 is a global memory, and 241 is a controller.

The processor array 211 is a plurality of processor elements 213 connected in a two dimensional matrix. Each processor element 213 corresponds to a grid point labeled by the maze running, and a communication port connects neighboring processor elements 213. At a labeling, labeling information is transmitted to the neighboring processor element 213 via this communication port. Each processor element 213 comprises a processor memory for retaining various data necessary for wiring, an operation circuit for executing an operation for these data, and four communication ports for communicating with the neighboring processor elements 213.

Figure 3A:
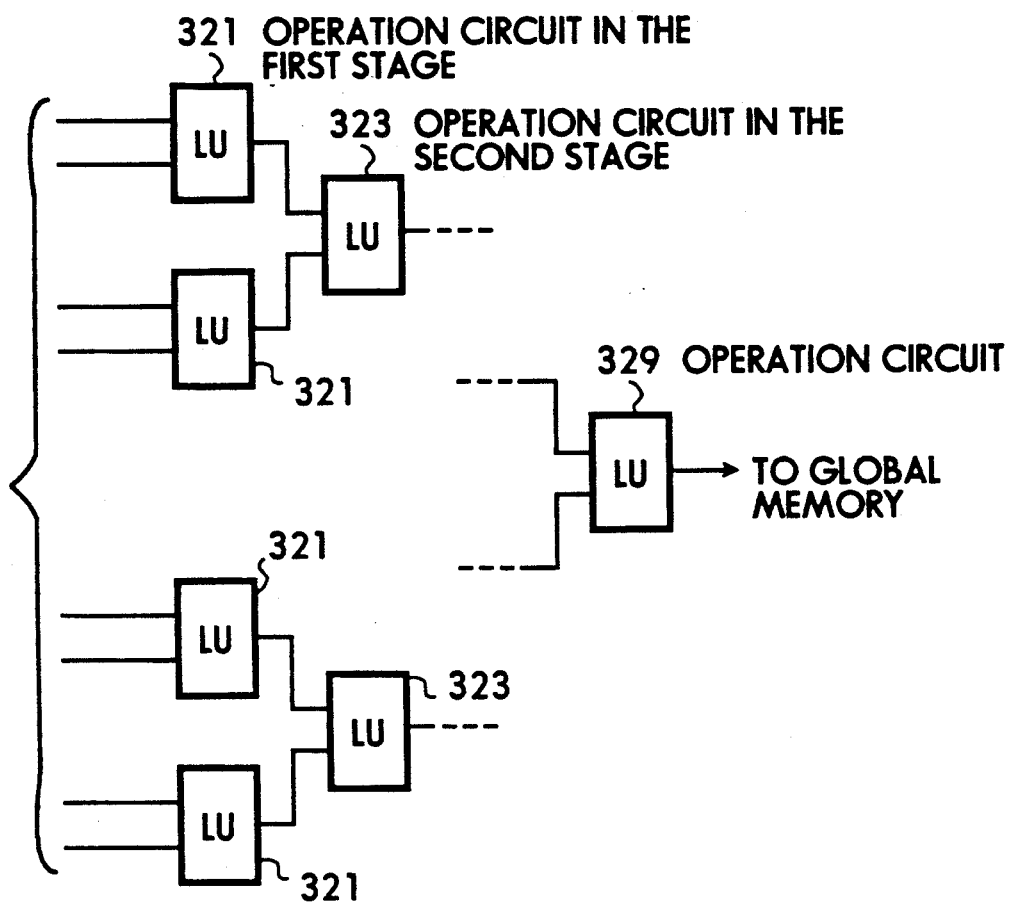
FIG. 3A is a block diagram of a collection logical operation circuit used in the preferred embodiment.

The collection logical operation circuit 221 is connected to all the processor elements 213 of the processor array 211, and makes a predetermined operation for all output data. Predetermined operations include logical product, logical sum, addition, maximum value computation, minimum value computation and the like. The detailed configuration of the collection logical operation circuit 221 comprises a plurality of operation circuits (LU) 321, 323, . . . , 329 of a tree structure, as shown in FIG. 3A. Each operation circuit executes the above predetermined operation for the two inputs, and the kind of operation is instructed by the controller 241. Each pair of processor elements 213 is connected with an operation circuit 321. Each operation circuit 321 makes a predetermined operation for the output data from two corresponding processor elements 213 and inputs the operation result to the operation circuit 323 of the next stage. Likewise, the operation circuit 323 performs the predetermined operation for the output data from the two operation circuits 321. Finally, the result of the predetermined operations for the output data from all the processor elements 213 is output from the operation circuit 329 of the final stage. These output data are output as the operation result of the collection operation circuit means.

Generally, regarding the processor array 211 having $2^n$ pieces of processor elements 213, $2^n$ pieces of input are input to an operation circuit 321 in the first stage of the collection logical operation circuit 221. The operation circuit 321 sends $2^n \times \frac{1}{2} = 2^{n-1}$ pieces of output to an operation circuit 323 in the second stage. Accordingly, to obtain one output (e.g. a maximum) from the outputs from $2^n$ pieces of the processor elements 213, a use of the collection logical operation circuit 221 comprising n stages of operation circuits is sufficient. A concrete example of the collection logical operation circuit 221 is disclosed in Japanese Patent Application No. 1988-234545 (which is incorporated by reference).

The global memory 231 retains the common data sent to all the processor elements 213 and retains the operation result of the collection logical operation circuit 221 after receiving it.

The controller 241 gives an operating instruction such as operation execution and data input/output for each processor element 213, as well as an operating instruction such as the operation execution and the kind of operation to the collection logical operation circuit 221 and performs a sequential control for determining the wiring pattern by the maze running.

FIG. 3B shows the data content of the processor memory (not shown in the drawings) set in each processor element 213 and in the global memory 231.

The content of the global memory 231 comprises an arrow directional label (4 bits), coordinate X (16 bits) and coordinate Y (16 bits).

The content of the processor memory comprises a wiring prohibition flag (1 bit), a source flag (1 bit), a target flag (1 bit), an arrow (North) directional label (1 bit), an arrow (East) directional label (1 bit), an arrow (South) directional label (1 bit), an arrow (West) directional label (1 bit), coordinate X (16 bits), coordinate Y (16 bits), a back-trace starting point flag (hereafter referred to as a starting point flag: 1 bit), and a back-trace starting point candidate flag (hereafter referred to as a candidate flag: 1 bit). Also, hereafter the arrow directional label and the arrow directional label flag are both called directional labels.

The following is an explanation of the operation when the maze running is applied to the embodiment of the above configuration. Labeling and back-trace are explained separately.

(I) Labeling

Figure 4A:
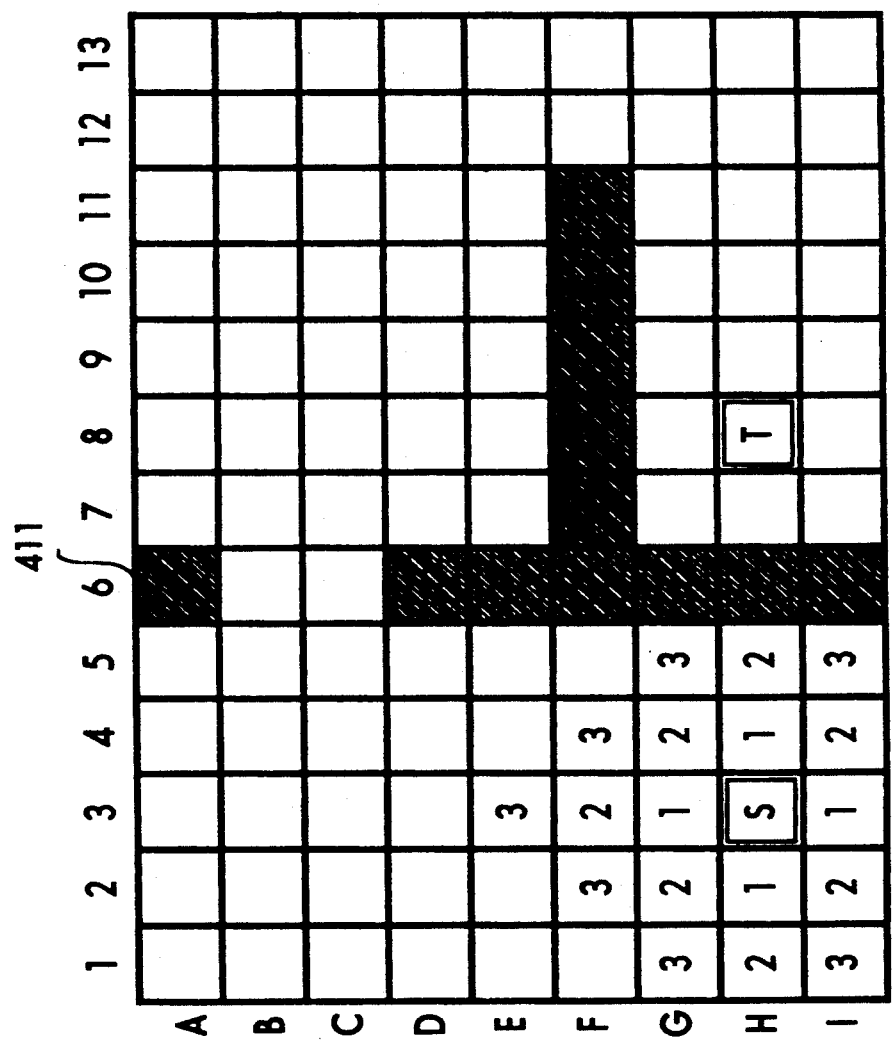
Figure 4C:
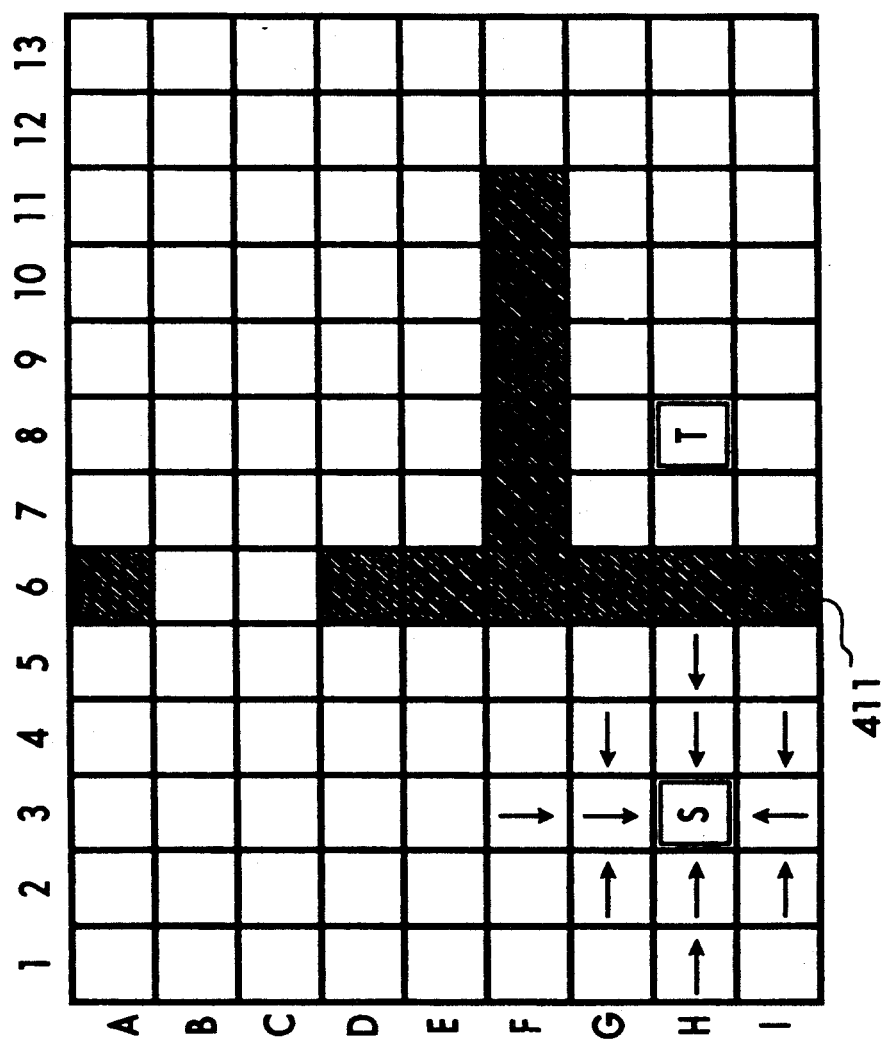
Figure 4D:
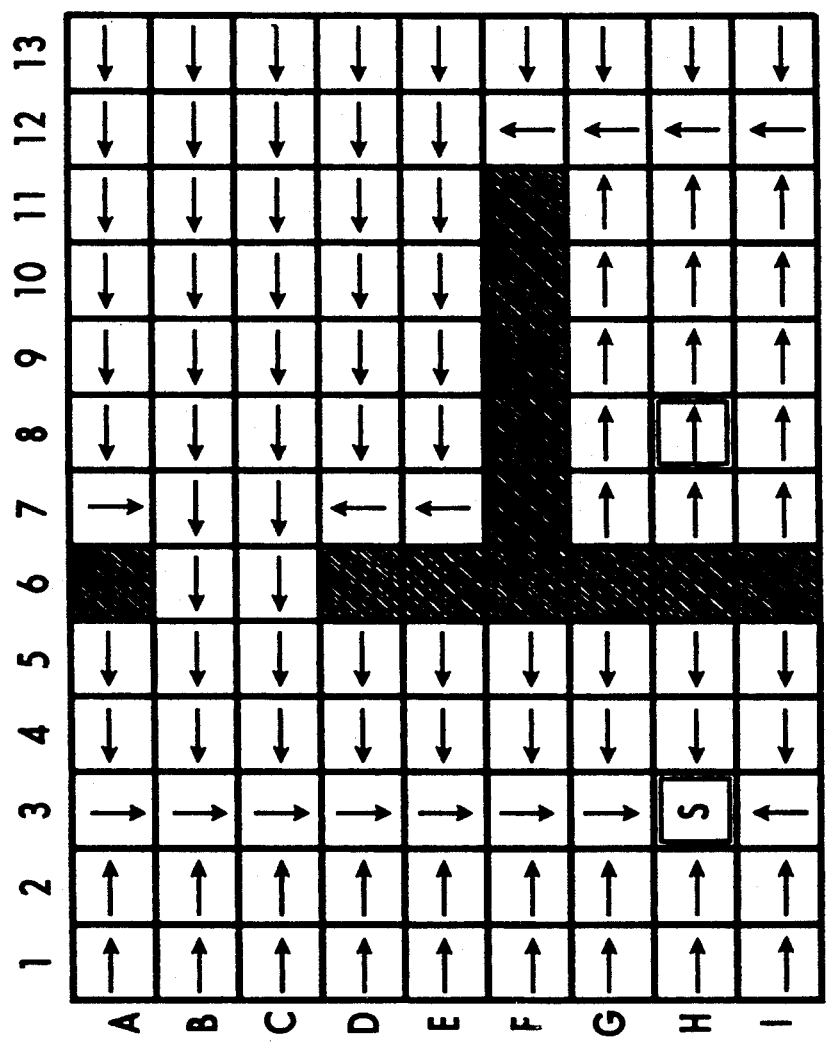
Figure 5:
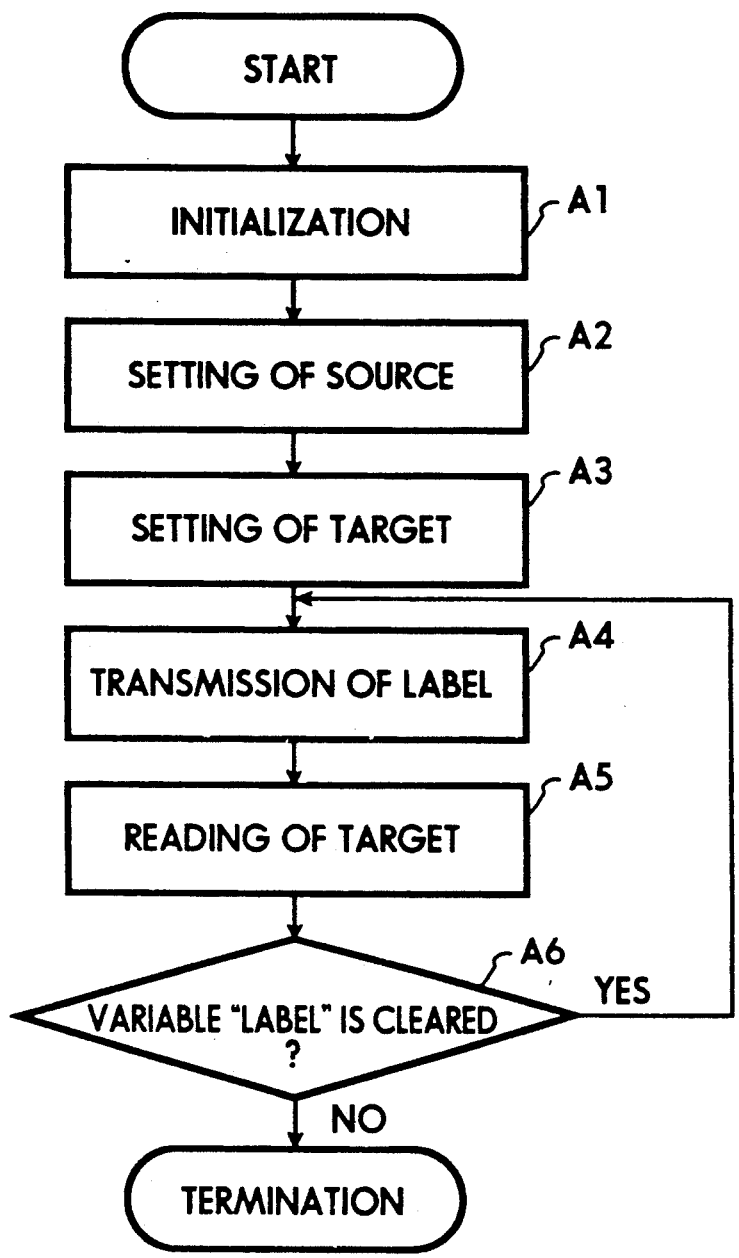
FIG. 5 is a flow chart explaining the operation of the labeling of this embodiment, FIGS. 6A through 6G explains the back-trace of the embodiment.

FIGS. 4A through 4D outline the labeling of the embodiment. FIG. 5 shows its operating process. In the embodiment, a plane divided into $9 \times 13$ grid points, as shown in FIG. 4A, is considered, and each processor element 213 corresponds to a grid point. The processor element 213 corresponding to the grid point (the shadowed area in FIG. 4A) having an interference (line alignment prohibited area 411) does not participate in the processing of a wiring pattern determination, for instance with its operation being halted.

Suppose first the controller 241 performs a labeling with the grid point of coordinate (3-H) as a source, S and the grid point of coordinate (8-H) as a target T, to determine the wiring path from the source S to the target T. Suppose also that the controller 241 gives operational instructions to each processor element 213, collection logical operation circuit 221, and the global memory 231.

Step A1: (Initialization)

The controller 241 clears the variables, "source flag", "target flag", "directional label", "coordinate X", "coordinate Y", "starting point flag", and "candidate flag" of the processor memory in each processor element 213.

Step A2: (Setting of a Source)

The controller 241 gives an instruction to the processor element 213 in the grid point of coordinate (3-H) corresponding to a source. This processor element 213 then sets a seal S meaning a source to the variable "source flag" in its processor memory.

Step A3: (Selection of a Target)

The controller 241 gives an instruction to the processor element 21 3 of coordinate (8-H) corresponding to a target. This processor element 213 then sets a variable "target flag" to "1" in the processor memory. All other processor elements 213 then set their own variable "target flag" to "0" in the processor memory.

Step A4: (Transmission of a Label)

Only the processor element 213 not in the wiring-pattern alignment prohibited area 411, whose variables "directional label", "coordinate X", "coordinate Y", "starting point flag", and "candidate flag" are in the cleared condition, performs the following processings.

In the labeling of this embodiment, a label is expressed directionally by an arrow in lieu of a number. The four directions pointed to by the arrow are expressed by a few bit data (e.g. 4 bits).

First, as shown in FIG. 4A, numbers are assigned from the source S to its neighboring grid points using the wavefront method. Second, as shown in FIG. 4B, the number is incremented until the grid point to which the number is assigned contains the target T. Second, as shown in FIG. 4C, an arrow is assigned to each grid point, so that the arrow direction points from the grid point of a larger number to the grid point of a smaller number. In a grid point having two or three neighboring grids with a smaller number, any of the arrow directions may be determined in accordance with the predetermined priority. In this embodiment, an arrow pointing East or West has priority over an arrow pointing North or South. For example, in FIG. 4B, the two grid points, each assigned with a number, are determined to have an East or West arrow direction in accordance with the priority, although East-West or North-South arrow directions are considered for the grid point where "2" is assigned, with respect to the two neighboring grid points where the number "1" is assigned, as shown in FIG. 4C. As a result, an arrow direction as shown in FIG. 4C is assigned to each grid point.

This kind of arrow direction assignment operation is performed in all grid points pursuant to the numbers shown in FIG. 4B. As a result, as shown in FIG. 4D, arrow directions are assigned to all grid points. This corresponds to a storage of "1" in any of the (North, East, South, or West) directional labels.

The above description explains the case of determining the arrow direction based on a numeric label. The arrow direction of each neighboring grid point is set to point to the grid point itself. When any of the four directions is considered as a neighboring grid point, the East-West directions have priority over the North-South directions. When an arrow direction is used in lieu of a number for the label, the arrow directions of all grid points are determined as shown in FIG. 4D.

In this manner, each processor element 213 concurrently determines the variable "directional label".

Step A5: (Reading of a Target)

When the determination of the variable "directional label" of each processor element 213 is completed, the processor element 213 corresponding to the target and all other processors respectively outputs the determined value of the variable "target flag", i.e., "1"; and that of the variable "target flag", i.e., "0" to the collection logical operation circuit 221.

The collection logical operation circuit 221 outputs the maximum calculated from the output of each processor element 213. This output is simply the value of the variable "target flag" of the processor element 213 corresponding to the target, and is sent to the controller 241 via the global memory 231.

Step A6: (Termination Judgment)

The controller 241 judges or determines whether or not the value of the variable "target flag" of the processor element 213 corresponding to the target is in the cleared condition. If it is, the assignment of a directional label per labeling has not reached the target. The controller 241 judges positively and goes back to step A4 and repeats the processings.

If the variable "target flag" is not in the cleared condition, i.e., if the variable "target flag" is "1", it indicates the assignment of the directional label flag has reached the target. Therefore, the controller 241 judges negatively and terminates the processing related to labeling.

(II) Back-Trace

Figure 6A:
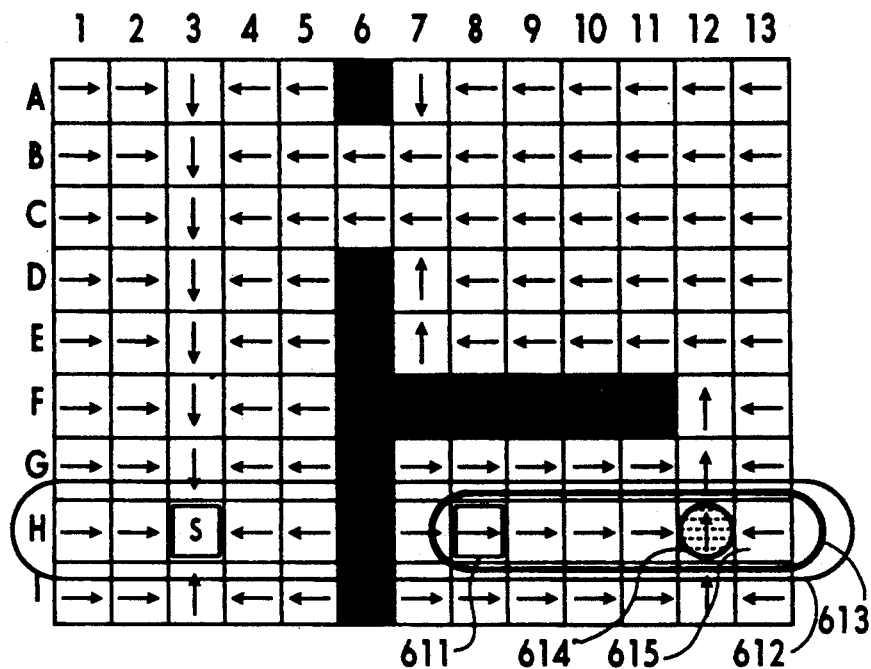
Figure 6B:
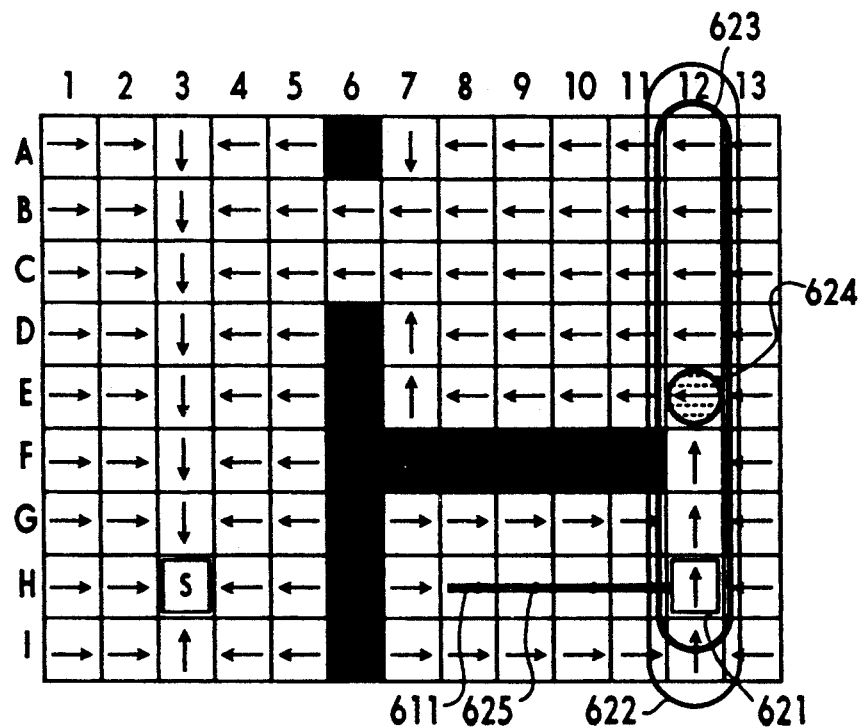
Figure 6C:
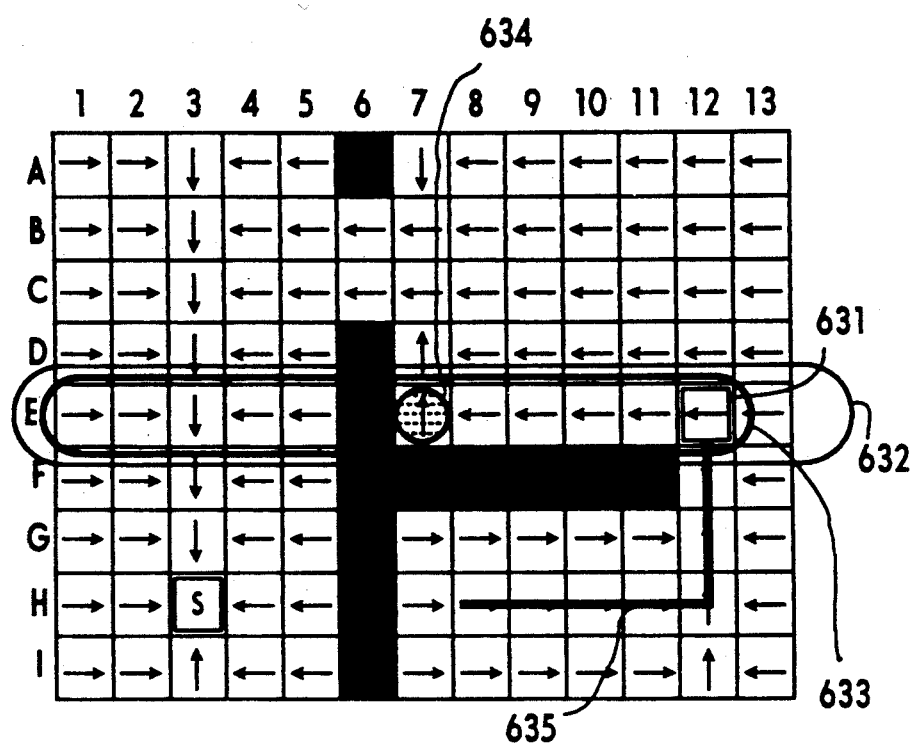
Figure 6D:
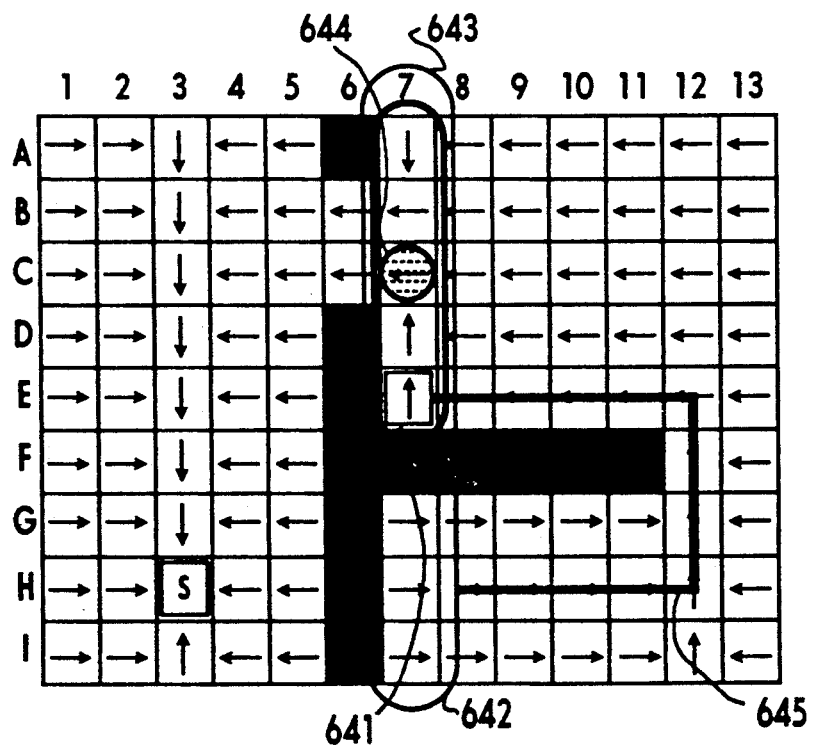
Figure 6E:
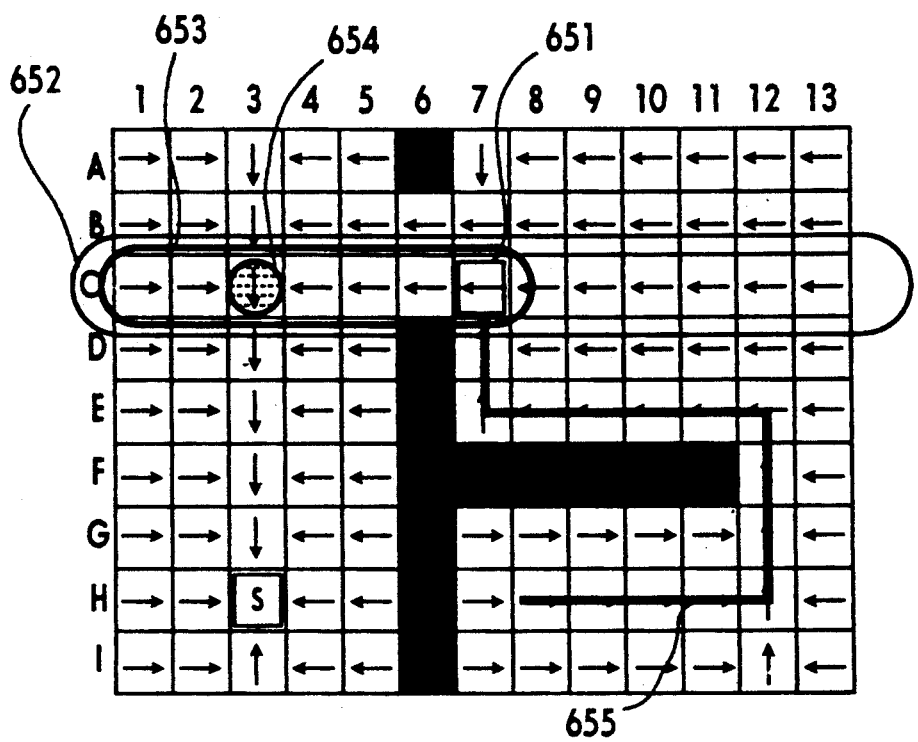
Figure 6F:
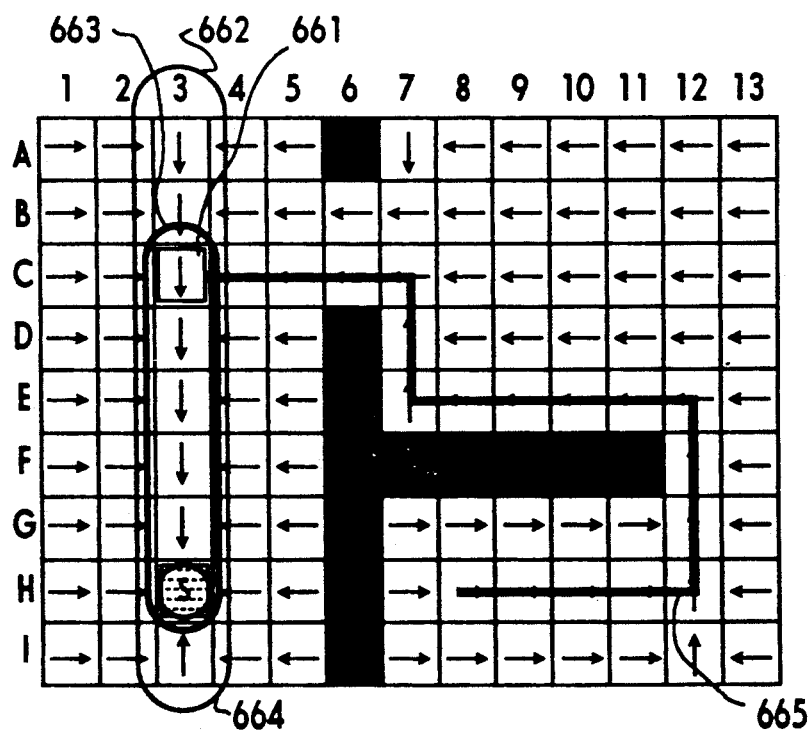
Figure 6G:
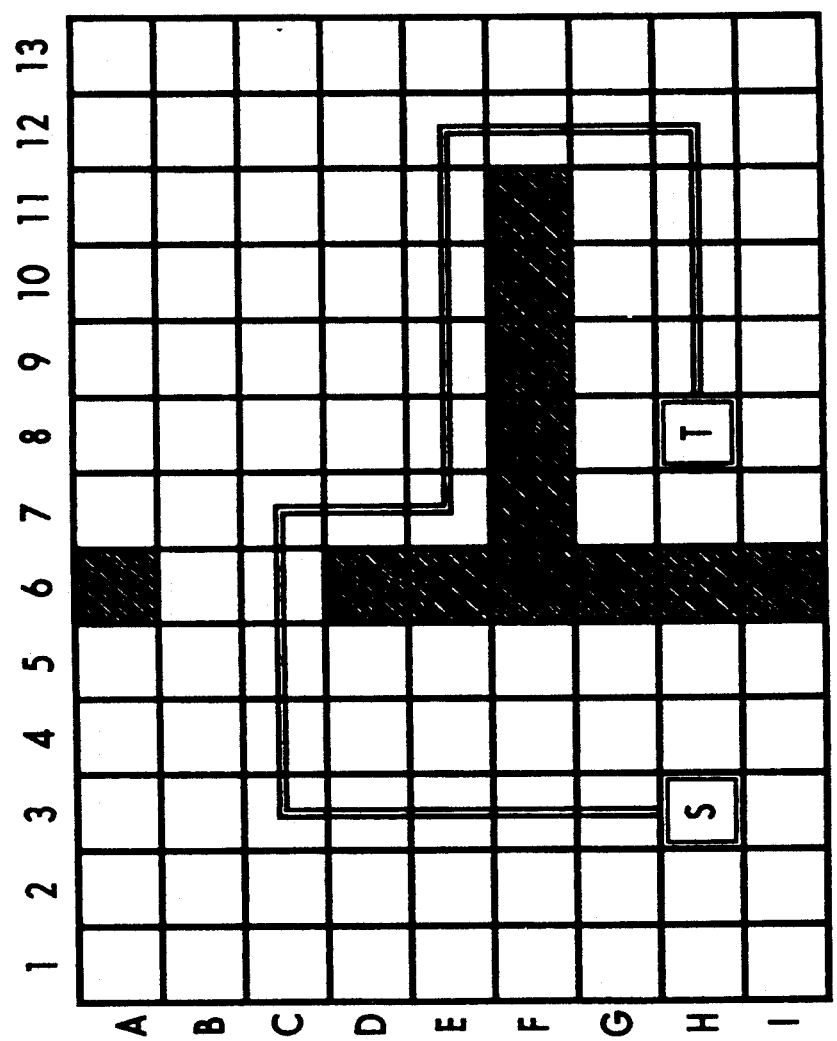
Figure 7A:
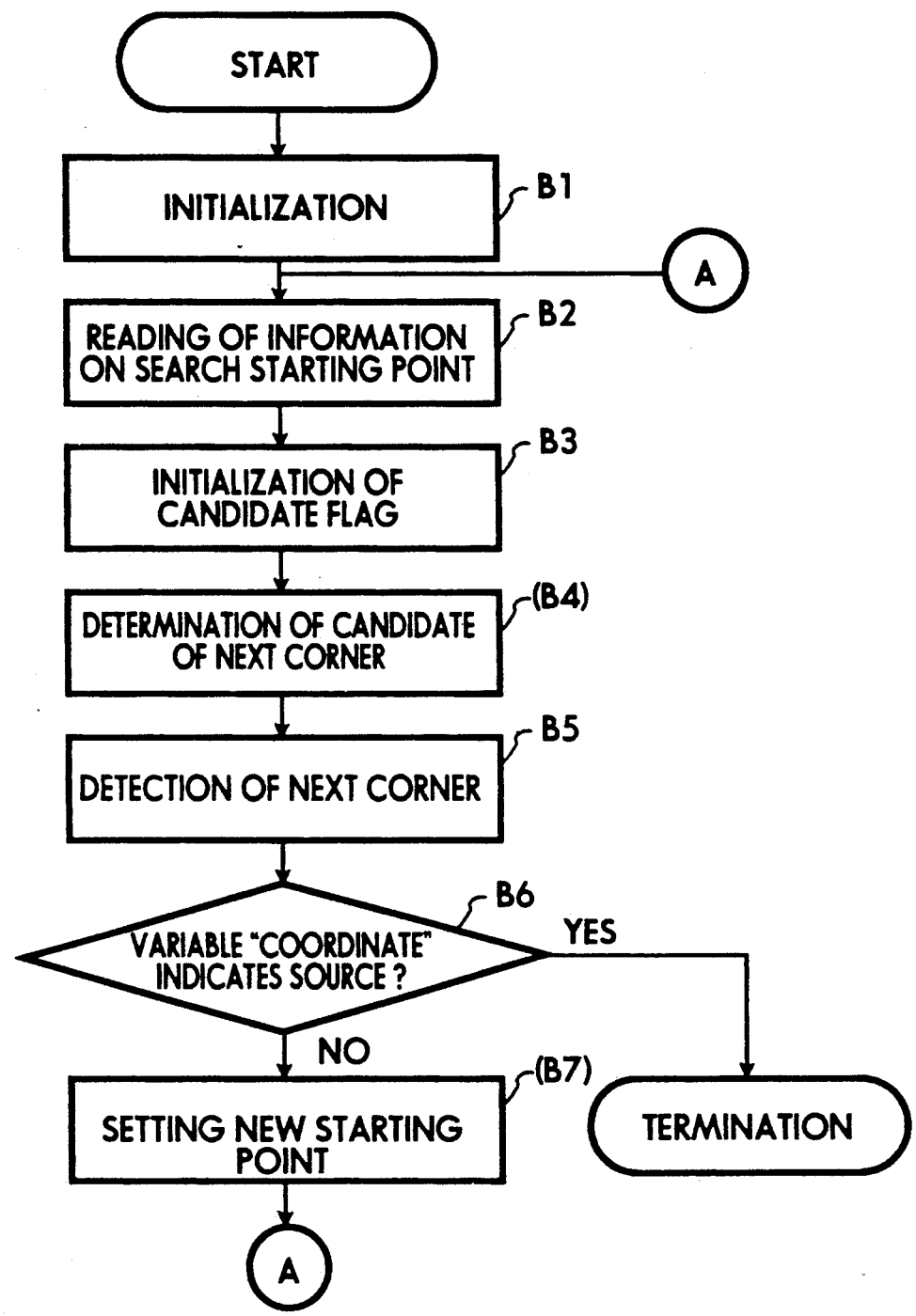
FIGS. 7A and 7B are flow charts explaining the operation of the back-trace of this embodiment.
Figure 7B:
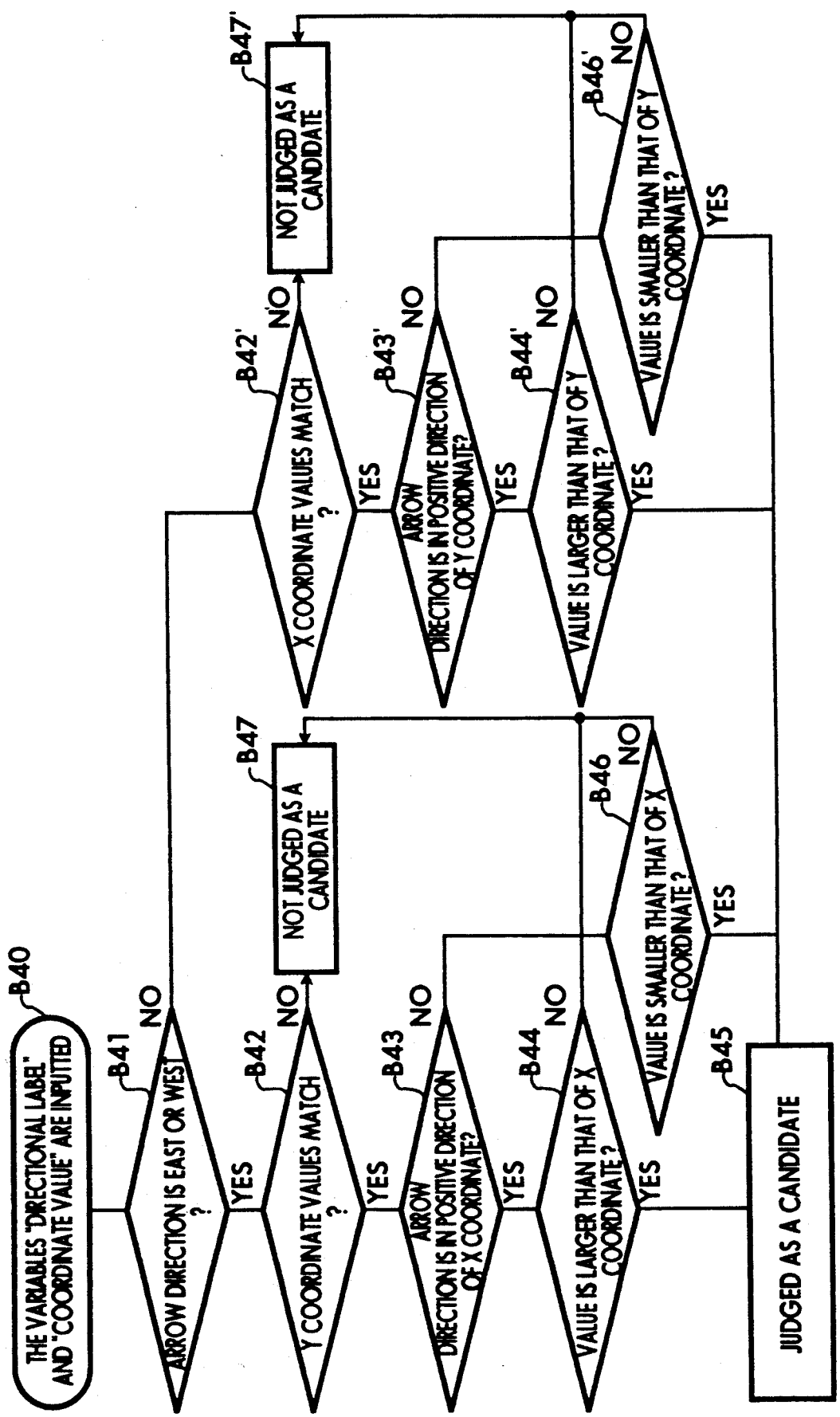

FIGS. 6A through 6G show how the back-trace of the embodiment progresses, and FIGS. 7A and 7B show the operating procedures of the back-trace. Each processor element 213 retains its own coordinate grid point (the coded value of e.g. the grid point of coordinate (2-H)) in its own processor memory.

In FIGS. 6A through 6F, a rectangular mark indicates current starting points, 611, 621, 631, 641, 651 and 661; a thin ecliptic mark indicates grid points 612, 622, 632, 642, 652 and 662 on the same Y coordinate as the starting point; a bold elliptic circle indicates starting point candidate grid points 613, 623, 633, 643, 653 and 663; a circular mark indicates the next starting point grid points 614, 624, 634, 644, 654 and 664; and a bold solid bee line indicates wiring patterns 625, 635, 645, 655 and 665 determined as the back-trace progresses.

In FIG. 6A, the target T on the grid point of the coordinate (8 H) is set as starting point 611. First, as the directional label of starting point 611 points in the positive direction of coordinate X (the East direction), all grid points 612 on the X coordinate in the same and opposite directions of the arrow direction in the grid point of starting point 611 are detected. Second, a grid point having a larger X coordinate value is set as starting point candidate grid point 613. As later described, the grid point with the least X coordinate value is determined from among starting point candidate grid points 613 and is set as the next starting point grid point 614. Then, as shown in FIG. 6B, the wiring pattern 625 is determined from starting point grid point 611 to the next starting point grid point 614, and wiring pattern 625 is determined immediately. Similar processings are repeatedly performed as shown in FIGS. 6B through 6F, so that a wiring pattern is formed from the target T to the source S, as shown in FIG. 6G.

The operation of the back trace will be explained by referring to FIG. 7A.

Step B1: (Initialization)

The controller 241 assigns "1" and "0", respectively, to a variable "starting point flag" in the processor memory of the each processor element 213 corresponding to the target and the processor elements 213 not corresponding to the target.

Step B2: (Reading the Information at a Search Starting Point)

The processor element 213 whose variable "starting point flag" "1" is initially assigned to the processor element 213 corresponding to the target, outputs the flag of the variable "directional label" (which is the direction of the arrow assigned in the labeling) and its coordinate value to the collection logical operation circuit 221. All other processor elements 213 output "0" as the variable "directional label" and the coordinate value to the collection logical operation circuit 221.

The collection logical operation circuit 221 outputs the maximum of each processor element 213, obtained from the calculation of the compared value of the output from each processor element 213. These outputs (the flag of the variable "directional label" and the value of the variable "coordinate value") are respectively stored in the variable "directional label" and the variable "coordinate value" of a global memory 231.

Step B3: (Initialization of a Candidate Flag)

The controller 241 assigns "0" to a variable "starting point candidate flag" in the processor memory of all processor elements 213.

Step B4: (Determination of a Candidate of the Next Corner)

The controller 241 inputs (broadcasts) each value of the variable "directional label" and the variable "coordinate value" of the global memory 231 to all processor elements 213. Each processor element 213 input with these values assigns "1" to the variable "candidate flag", when the following conditions [1] and [2] are met.

Condition [1]: The processor element 213 is located in the direction of the arrow shown in the variable "directional label" viewed from the grid point shown in the variable "coordinate value" input from the global memory 231. That is, the processor element 213 is located on the line drawn in the direction of the arrow shown in the variable "directional label" from the grid shown as the variable "coordinate value".

Condition [2]: An arrow direction different from that shown in the variable "directional label" of the global memory 231 is set to its own variable "directional label" in the processor element 213.

The above condition [1] is shown more concretely in the flow chart of FIG. 7B. First, the variables "directional label" and "coordinate value" are input to the controller 241 (B40). Then, when the arrow direction points East or West (B41), it is judged whether or not the "Y coordinate value" of the processor memory and the "Y coordinate value" of the starting point stored in the global memory 231 match (B42). Among those that match (like grid point 612 shown with a thin elliptic circle in FIG. 6A), when the variable "directional label" in the processor memory points in the positive direction of the X coordinate (B43), the grid (starting point candidate grid 613 marked by a bold elliptic circle shown in FIG. 6A) having a processor element 213 whose processor memory has a larger X coordinate value than the X coordinate value of the starting point (B44) is judged as a corner candidate (B45). When the Y coordinate value of the processor memory and the Y coordinate value of the starting point do not match (B46), a grid having such a processor memory is not a candidate for a starting point or a corner (B47). Also, a processor memory whose X coordinate value is not larger than the X coordinate value of the starting point (B44) is not a candidate (B47). If the arrow direction of the processor memory is not positive, when the X coordinate value of its processor memory is smaller than the X coordinate value of the starting point (B46), it is judged as a candidate (B45); but if it is not smaller, it is not judged as a candidate (B47). If the variable "directional label" is not horizontal (East or West), processing is performed at each of the steps B42', B43', B44', B45', B46' and B47' in FIG. 7B, as at each of the steps B42, B43, B44, B45, B46, and B47.

Step B5: (Detection of the Next Corner)

The processor element 213 in which "1" is assigned to variable "candidate flag", outputs the coordinate element in the arrow direction shown in the variable "directional label" of the global memory 231 to the collection logical operation circuit 221, the coordinate element being selected from the coordinate values of the processor element 213. For instance, in FIG. 4D, when the East direction is assigned to the variable "directional label" of the global memory 231, the processor element 213 (the processor element 213 on the grid point of coordinate (12-H)) in which "1" is assigned to variable "candidate flag", outputs the arrow direction element among its coordinate values, i.e. the horizontal direction element (the coded value of 12).

The processor element 213 whose "candidate flag" "0" is assigned, outputs the expressible maximum (e.g. when the coordinate value is coded in eight bits, all bits are set to "1") to the collection logical operation circuit 221 if the arrow direction shown in the variable "directional label" of the global memory 231 is in the positive direction; and the processor element 213 outputs "0" to the collection logical operation circuit 221, if the arrow direction shown in the variable "directional label" of the global memory 231 is in the negative direction.

The collection operation logical circuit 221 computes the minimum or the maximum, respectively, when the arrow direction shown in the variable "directional label" of the global memory 231 is the positive direction or the negative direction. The coordinate of the first processor element 213 located in this arrow direction but of a different direction (the coordinate in the arrow direction) is determined by computing the minimum or the maximum, depending on the arrow direction. For instance, in FIG. 6A, the arrow directions of both the next starting point 614 and its right neighboring grid point 615 are different from the arrow direction of the target starting point 611. Since the next starting point 614 is a first grid whose arrow direction is different from that of the target, it is determined as the next corner.

The result of the logical operation is stored in the element of the arrow direction shown in the variable "directional label" among the variable "coordinate values" in the global memory 231.

The controller 241 designates the computation of either the minimum or the maximum at the collection logical operation circuit 221.

Step B6: (Termination Judgment)

The controller 241 reads the variable "coordinate value" in the global memory 231, and judges whether or not this value indicates the source. In case of a positive judgment when the back-trace has reached the source, the controller 241 terminates processings related to the back-trace. In case of a negative judgment, the controller 241 continues the following operations.

Step B7: (Setting of a New Search Starting Point)

The controller 241 broadcasts the value of the variable "coordinate value" in the global memory 231 to all processor elements 213. It then compares the input value of the variable "coordinate value" with its own coordinate value and sets the variable "starting point flag" in the processor memory to "1" or "0", respectively, whether the compared values are the same or not same.

Then, the controller 241 goes back to step B2 and repeats the processings.

Thus, each corner of the wiring pattern to be determined is referenced and the next corner is obtained along the label (the arrow direction shown in the variable "directional label" in the global memory 31), the label corresponding to this corner. This operation is performed for each corner, and the wiring pattern is determined, until the back-trace finally reaches the source.

For example, as shown in FIG. 6G, the grid point of coordinate (12-H) is detected as the first corner; then, the grid points of coordinates (12-E), (7-E), (7-C) and (3-C) are detected as the next corners in step B5; and finally source grid point of coordinate (3-H) is detected. The path connecting the center of each grid point of these coordinates becomes the wiring pattern.

Therefore, the bee line paths between two consecutive corners are determined at once when a back-trace is performed, and the processing is sped up. Generally the number N of grid points corresponding to the total length of a wiring pattern is far greater than the number M of corners (i.e. N>M), and the time required for the processing is shortened to approximately M/N.

In the embodiment of this invention described above, the global memory 231 in each processor element 213 secures storage areas for such variables as "starting point" and "coordinate value". But specialized hardware can be used, by providing such registers as a starting point register and a coordinate value register specifically for storing the values of such variables.

Also the embodiment explains how the determination of the wiring pattern on a plane is determined. This invention is also applicable to the determination of the wiring pattern for a multilayer PC board, etc.

As described so far, this invention determines the wiring pattern by detecting the next corner of this reference point based on the label corresponding to a reference point. Since the back-trace of the maze running is sped up by determining the bee line paths between two consecutive corners at once, this invention is extremely practical.

What is claimed is:

1. A wiring-pattern-determination system implemented by a computer including processors connected orthogonally to each other, each having a processor memory, comprising:

label setting means, implemented by the computer, for setting labels corresponding to each of the processors from a starting point to an ending point by performing a labeling operation utilizing a maze running and storing each of the labels in each processor memory;

reference point setting means, implemented by the computer, for setting a corner of a wiring pattern to be determined by setting said ending point as a reference point assigned with a label for a back-trace, performed by a collection logical operation circuit connected to the processors, of said maze running;

corner judging means, implemented by the computer, for determining a next corner of the wiring pattern as a next reference point based on the label assigned to the reference point by said reference point setting means;

termination judging means, implemented by the computer, for determining a termination of the back-trace when said starting point and the next corner determined by said corner judging means match; and reference point revising means, implemented by the computer, for instructing said reference point setting means to set said next corner as a new reference point when said starting point and the next corner determined by said corner judging means mismatch.

2. The wiring-pattern-determination system according to claim 1, wherein said labeling operation performed by said label setting means is applied to a subject plane which is divided into a plurality of grid points, and a processor element is assigned to each of said grid points.

3. The wiring-pattern-determination system according to claim 2, wherein said labeling setting means comprises:

means for initializing each processor element including source and target processor element;

means for setting a source at the source processor element provided at the starting point of said wiring pattern;

means for setting a target at the target processor element provided at the ending point of said wiring pattern;

means for sequentially transmitting a label from said source to said target;

means for determining whether the label has been transmitted until the label is transmitted to the target; and means for ending the labeling operation when the label has been transmitted to the target.

4. The wiring-pattern-determination system according to claim 3, wherein said means for determining comprises means for reading a target flag in the processor element, for determining whether the target flag is cleared and for transmitting the label to an adjacent processor element.

5. The wiring-pattern-determination system according to claim 2, wherein said reference point setting means reads the starting point for said back-trace, and said corner judging means comprises:

means for initializing a candidate flag in each processor element;

means for determining corner candidates; and means for determining the next corner selected from said corner candidates.

6. The wiring-pattern-determination system according to claim 5, wherein said means for determining corner candidates comprises:
  means for determining whether a particular processor element is on a line drawn in an arrow direction of the reference point from a coordinate of a reference point; and
  means for determining whether the arrow direction of the particular processor element is different from the arrow direction of the reference point, and
  said means for determining the next corner selects a minimum coordinate from the corner candidates when the arrow direction of the reference point is positive or selects a maximum coordinate from the corner candidates when the arrow direction of the reference point is negative.

7. The wiring-pattern-determination system according to claim 6, wherein said means for determining the next corner comprises the collection logical operation circuit including a plurality of stages of comparison circuits, each having a first stage of the comparison circuits which receives outputs of two processor elements, and a last stage of the comparison circuits for providing a maximum or a minimum output.

8. The wiring-pattern-determination system according to claim 5, wherein said means for determining corner candidates comprises:
  means for detecting whether an arrow direction in a particular processor element having X and Y coordinates is horizontal;
  means for detecting whether the Y coordinate of the particular processor element is the same as that of the reference point when the arrow direction in the particular processor element is horizontal;
  means for determining whether the arrow direction of the reference point is positive; and
  means for determining whether the X coordinate of the particular processor element is larger than the reference point and for determining that the particular processor element is a candidate of the X coordinate of the particular processor element and is larger than the reference point.

9. A wiring-pattern determination method implemented by a computer including processors connected orthogonally to each other, each having a processor memory, comprising steps of:
  (a) setting labels corresponding to each of the processors from a beginning point to an ending point by performing a labeling operation utilizing a maze running and storing each of the labels in each processor memory using the computer;
  (b) setting a corner of a wiring pattern to be determined by setting said ending point as a reference point assigned with a label for a back-trace, performed by a collection logical operation circuit connected to the processors, of said maze running using the computer;
  (c) determining a next corner as a next reference point based on the label assigned to the reference point using the computer;
  (d) determining a termination of the back-trace when said beginning point and the next corner determined by said determining step (c) match using the computer; and
  (e) setting the next corner as a new reference point when said beginning point and the next corner determined by said determining step (c) mismatch using the computer.

10. The wiring-pattern-determination system according to claim 9, wherein said labeling operation performed by said setting step (a) is applied to a subject plane which is divided into a plurality of grid points, and a processor element is assigned to each of said grid points.

11. The wiring-pattern-determination system according to claim 10, wherein said setting step (a) comprises the steps of:
  (a1) initializing each processor element including source and target processor elements;
  (a2) setting a source at the source processor element provided at the starting point of said wiring pattern;
  (a3) setting a target at the target processor element provided at the ending point of said wiring pattern;
  (a4) sequentially transmitting a label from said source to said target;
  (a5) determining whether the label has been transmitted until the level is transmitted to the target; and
  (a6) ending the labeling operation when the label has been transmitted to the target.

12. The wiring-pattern-determination system according to claim 11, wherein said determining step (a5) comprises the steps of:
  reading a target flag in the processor element; determining whether the target flag is cleared; and transmitting the label to an adjacent processor element.

13. The wiring-pattern-determination system according to claim 10, wherein said setting step (b) reads the starting point for said back-trace, and said determining step (c) comprises the steps of:
  (c1) initializing a candidate flag in each element;
  (c2) determining corner candidates; and
  (c3) determining the next corner selected from said corner candidates.

14. The wiring-pattern-determination system according to claim 13, wherein
  said determining step (c2) comprises the steps of:
    determining whether a particular processor element is on a line drawn in an arrow direction of the reference point from a coordinate of a reference point; and
    determining whether the arrow direction of the particular processor element is different from the arrow direction of the reference point, and
  said determining steps (c3) selects a minimum coordinate from the corner candidates when the arrow direction of the reference point is positive or selects a maximum coordinate from the corner candidates when the arrow direction of the reference point is negative.

15. The wiring-pattern-determination system according to claim 14, wherein said determining step (c3) is implemented by the collection logical operation circuit including a plurality of stages of comparison circuits, each having a first stage of the comparison circuits which receives outputs of two processor elements, and a last stage of the comparison circuits for providing a maximum or a minimum output.

16. The wiring-pattern-determination system according to claim 13, wherein said determining step (c2) comprises the steps of:
  detecting whether an arrow direction in a particular processor element having X and Y coordinates is horizontal;
  detecting whether the Y coordinate of the particular processor element is the same as that of the reference point when the arrow direction in the particular processor element is horizontal;
determining whether the arrow direction of the reference point is positive; and
determining whether the X coordinate of the particular processor element is larger than the reference point and for determining that the particular processor element is a candidate of the X coordinate of the particular processor element and is larger than the reference point.

* * * * *